(12) United States Patent
Lim et al.

(10) Patent No.: US 9,543,215 B2
(45) Date of Patent: Jan. 10, 2017

(54) PUNCH-THROUGH-STOP AFTER PARTIAL FIN ETCH

(71) Applicant: GLOBALFOUNDRIES Inc., Grand Cayman, KY (US)

(72) Inventors: Kwan-Yong Lim, Niskayuna, NY (US); Steven John Bentley, Watervliet, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/691,233

(22) Filed: Apr. 20, 2015

(65) Prior Publication Data

US 2016/0307807 A1  Oct. 20, 2016

(51) Int. Cl.
| | |
|---|---|
| *H01L 21/8238* | (2006.01) |
| *H01L 29/167* | (2006.01) |
| *H01L 21/324* | (2006.01) |
| *H01L 29/10* | (2006.01) |
| *H01L 21/308* | (2006.01) |
| *H01L 21/225* | (2006.01) |

(52) U.S. Cl.
CPC ... *H01L 21/823821* (2013.01); *H01L 21/2251* (2013.01); *H01L 21/308* (2013.01); *H01L 21/324* (2013.01); *H01L 21/823807* (2013.01); *H01L 29/1083* (2013.01); *H01L 29/167* (2013.01)

(58) Field of Classification Search
CPC .................... H01L 27/10879; H01L 27/10826
See application file for complete search history.

(56) References Cited

U.S. PATENT DOCUMENTS

| | | | | |
|---|---|---|---|---|
| 5,552,329 | A * | 9/1996 | Kim | ............ H01L 29/1083 257/E21.428 |
| 2014/0312393 | A1* | 10/2014 | Rodder | ............ H01L 29/66537 257/288 |
| 2015/0044829 | A1* | 2/2015 | Kim | ............ H01L 21/82380 438/199 |
| 2015/0060961 | A1* | 3/2015 | Yu | ............ H01L 29/785 257/288 |

* cited by examiner

*Primary Examiner* — Mohammad Choudhry
(74) *Attorney, Agent, or Firm* — Wayne F. Reinke, Esq.; Heslin Rothenberg Farley & Mesiti P.C.

(57) ABSTRACT

A method of reducing current leakage in three-dimensional semiconductor devices due to short-channel effects includes providing a starting semiconductor structure, the structure including a semiconductor substrate having a n-type device region and a p-type device region, the p-type device region including an upper layer of p-type semiconductor material, a hard mask layer over both regions, and a mask over the structure for patterning at least one fin in each region. The method further includes creating partial fin(s) in each region from the starting semiconductor structure, creating a conformal liner over the structure, creating a punch-through-stop (PTS) in each region, causing each PTS to diffuse across a top portion of the substrate, and creating full fin(s) in each region from the partial fin(s).

15 Claims, 6 Drawing Sheets

PUNCH-THROUGH-STOP AFTER PARTIAL FIN ETCH

BACKGROUND OF THE INVENTION

Technical Field

The present invention is generally related to the fabrication of three-dimensional semiconductor devices. More particularly, the present invention relates to introducing a punch-through-stop after a partial fin etch.

Background Information

In the fabrication of three-dimensional semiconductor devices, much effort has gone into reducing current leakage due to short-channel effects. Various attempts to do so have achieved varying degrees of success. For example, punch-through-stop (PTS) implants have been utilized at different stages of fabrication, each stage having unwanted trade-offs. For example, PTS implants after fin patterning have reduced dopant diffusion, giving better short channel control, but also introduced implant damage to the fin leading to mobility degradation. The opposite is true of implanting the PTS before fin patterning.

Thus, a need continues to exist for an effective way to combat short-channel effects while reducing or eliminating the unwanted trade-offs.

SUMMARY OF THE INVENTION

The shortcomings of the prior art are overcome and additional advantages are provided through the provision, in one aspect, of a method of reducing current leakage in three-dimensional semiconductor devices due to short-channel effects. The method includes providing a starting semiconductor structure, the structure comprising a semiconductor substrate having a n-type device region and a p-type device region, the p-type device region including an upper layer of p-type semiconductor material and a hard mask layer over both regions. The method further includes creating at least one partial fin in each region, creating a punch-through-stop (PTS) in each region, causing each PTS in a respective region to diffuse across an entire top portion thereof and below a top surface of the substrate, and creating at least one full fin in each region from the at least one partial fin in each region.

These, and other objects, features and advantages of this invention will become apparent from the following detailed description of the various aspects of the invention taken in conjunction with the accompanying drawings.

DETAILED DESCRIPTION OF THE INVENTION

Figure 1:
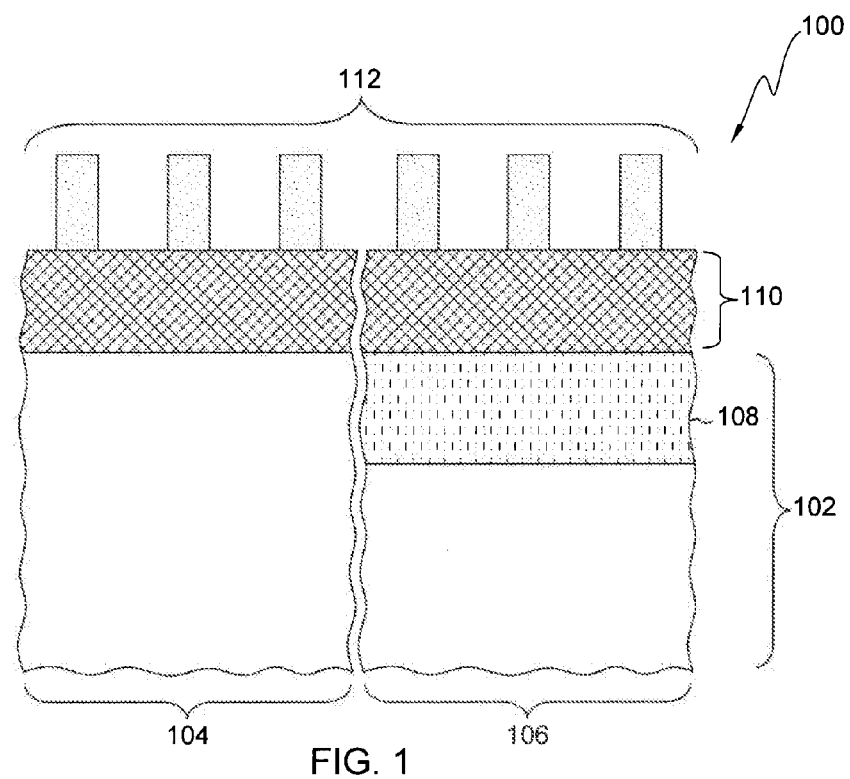
FIG. 1 is a cross-sectional view of one example of a starting three-dimensional semiconductor structure, the structure including a semiconductor substrate having a n-type device region and a p-type device region, the p-type device region including an upper layer of p-type semiconductor material, a hard mask layer over both regions and a mask over the structure for patterning at least one fin in each region, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should he understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified.

In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, hut is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The present invention reduces or eliminates current leakage due to short-channel effects in a three-dimensional semiconductor structure having one or both of n and p-type regions, by creating a punch-through-stop after partially etching the fins, then completing fin creation.

FIG. 1 is a cross-sectional view of one example of a starting three-dimensional semiconductor structure 100, the structure including a semiconductor substrate 102 having a n-type device region 104 and a p-type device region 106, the p-type device region including an upper layer 108 of p-type semiconductor material, one or both regions could be doped, one or both regions could be different materials from the substrate (e.g., epitaxy growth), a hard mask layer 110 over both regions and a mask 112 over the structure for patterning at least one fin in each region, in accordance with one or more aspects of the present invention.

The starting structure may be conventionally fabricated, for example, using known processes and techniques. Although only a portion is shown for simplicity, it will be understood that, in practice, many such structures are typically included on the same bulk substrate. Further, one or both device regions could have impurities (e.g., by doping) of the relevant type (in this example, the p-type region has p-type impurities). Still further, one or both regions could include one or more semiconductor materials different from the substrate (e.g., epitaxial semiconductor material grown on the substrate).

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

At least one raised semiconductor structure (raised with respect to the substrate) in each region will be created. In one example, the raised structures may each take the form of a "fin." The raised structure(s) may be etched from substrate 102, and may include, for example, any of the materials listed above with respect to the substrate. Further, some or all of the raised structure(s) may include added impurities (e.g., by doping), making them n-type or p-type.

Figure 2:
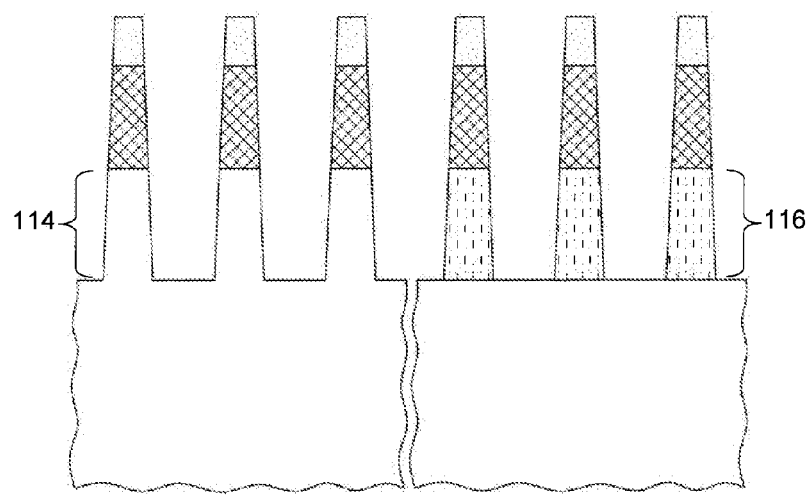
FIG. 2 depicts one example of the starting three-dimensional semiconductor structure of FIG. 1 after patterning to create at least one partial fin in each region, in accordance with one or more aspects of the present invention.

FIG. 2 depicts one example of the starting three-dimensional semiconductor structure of FIG. 1 after patterning to create at least one partial fin (114 and 116) in each region, in accordance with one or more aspects of the present invention.

In one example, the patterning may be accomplished using conventional processes and techniques (e.g., mask-based lithography and etching).

Figure 3:
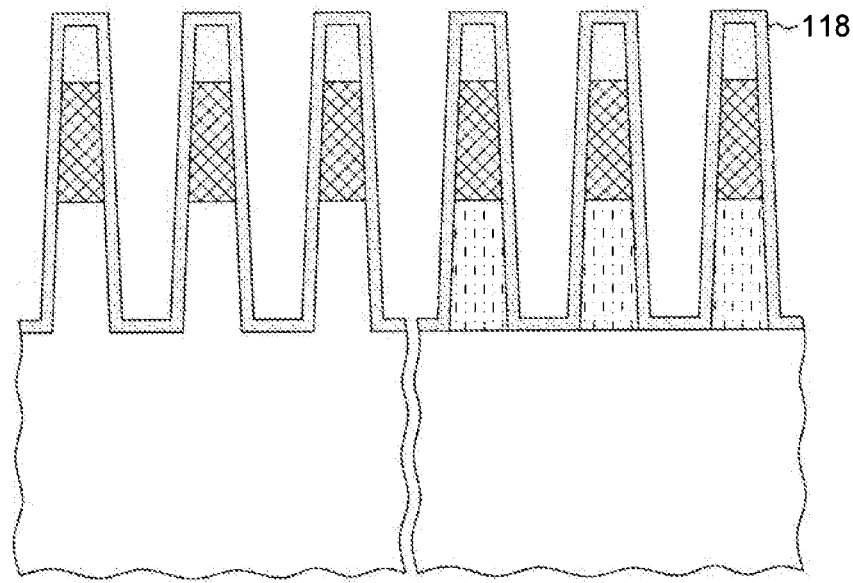
FIG. 3 depicts one example of the structure of FIG. 2 after creating a conformal liner over the structure, in accordance with one or more aspects of the present invention.

FIG. 3 depicts one example of the structure of FIG. 2 after creating a conformal liner 118 over the structure, in accordance with one or more aspects of the present invention.

In one example, the conformal liner may include, for example, a bottom layer of dielectric material having a thickness of, for example, about 1 nm to about 3 nm, and a top layer of a hard mask material having a thickness of, for example, about 1 nm to about 4 nm. In other examples, the liner may have a single layer or more than two layers, and could include one material or more than two materials. Creation of the conformal liner may be accomplished, for example, using conventional processes and techniques (e.g., deposition).

Figure 4:
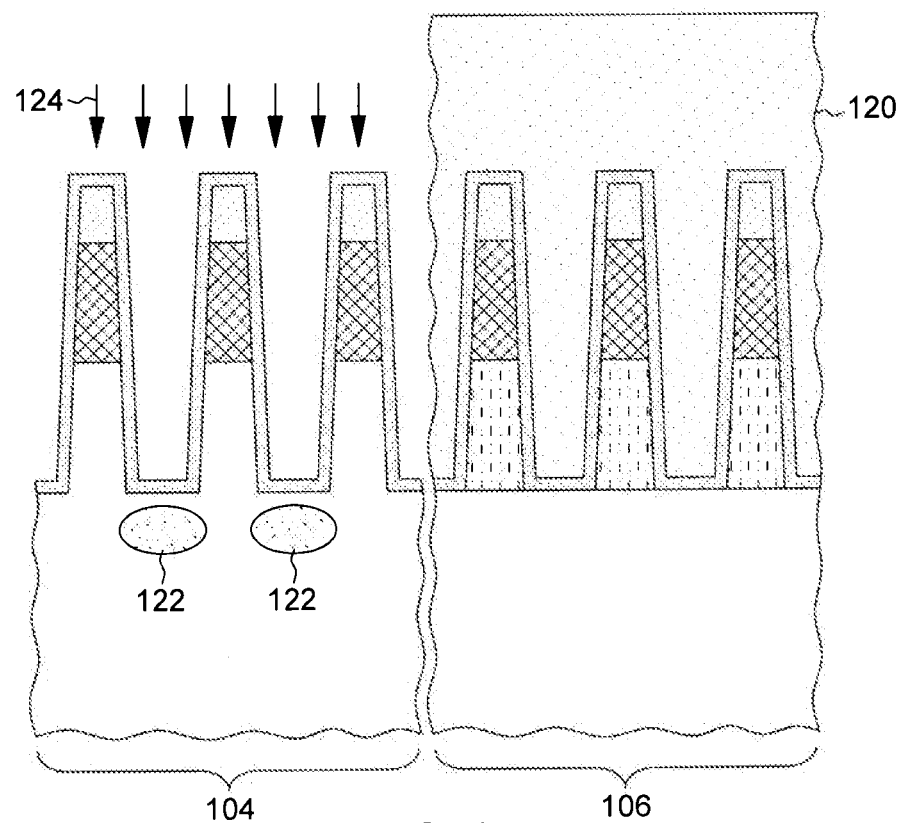
FIG. 4 depicts one example of the structure of FIG. 3 after creating a mask over the p-type device region and creating a punch-through-stop in the substrate of the n-type device region below and adjacent the at least one partial fin, in accordance with one or more aspects of the present invention.

FIG. 4 depicts one example of the structure of FIG. 3 after creating a mask 120 over the p-type device region 106 and creating a punch-through-stop 122 (e.g., using an implant 124) in the substrate of the n-type device region 104 below and adjacent the at least one partial fin, in accordance with one or more aspects of the present invention.

The mask 120 may include, for example, an organic planarization layer (OPL) material, an optical dispersive layer (ODL) material, or a spin-on hard mask material. Creation of the mask may be accomplished using conventional processes and techniques (e.g., blanket deposition followed by etch over n-type device region 104). In one example, PTS 122 may be created via conventional implant with, for example, boron or difluoroboron.

Figure 5:
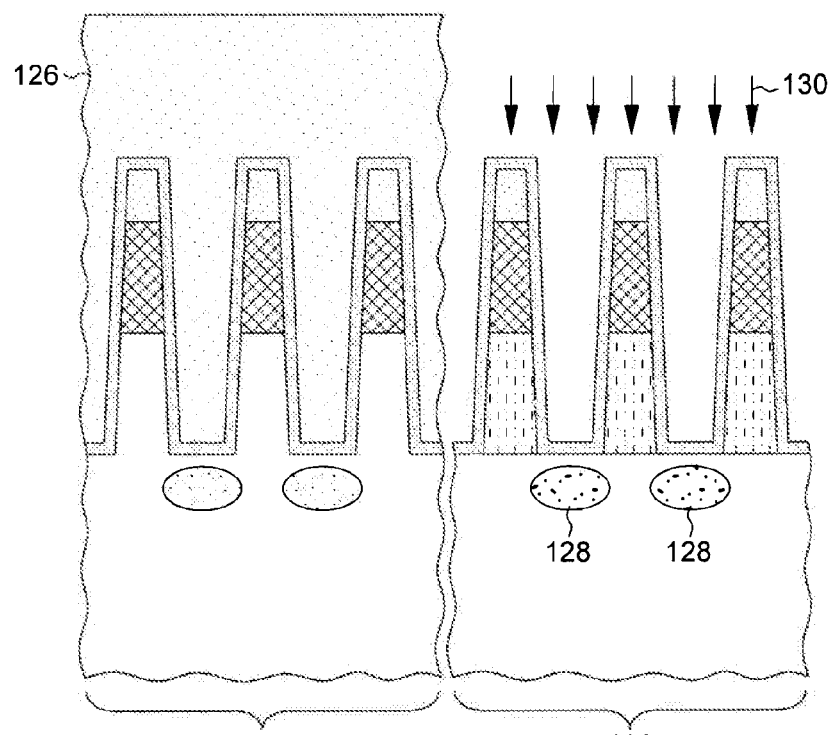
FIG. 5 depicts one example of the structure of FIG. 4 after removing the mask over the p-type device region, creating a mask over the n-type device region and creating a punch-through-stop at a top of the substrate of the p-type device region, in accordance with one or more aspects of the present invention.

FIG. 5 depicts one example of the structure of FIG. 4 after removing the mask (120, FIG. 4) over the p-type device region 106, creating a mask 126 over the n-type device region 104 and creating a punch-through-stop 128 (e.g., via implant 130) at a top of the substrate of the p-type device region, in accordance with one or more aspects of the present invention.

Removal of the mask over the p-type device region may be accomplished, for example, using conventional processes and techniques. The mask 126 may include, for example, an organic planarization layer (OPL) material, an optical dispersive layer (ODL) material, or a spin-on hard mask material. Creation of the mask may be accomplished using conventional processes and techniques (e.g., blanket deposition followed by etch over p-type device region 106). In one example, PTS 128 may be created via conventional implant with, for example, arsenic or phosphorus.

Figure 6:
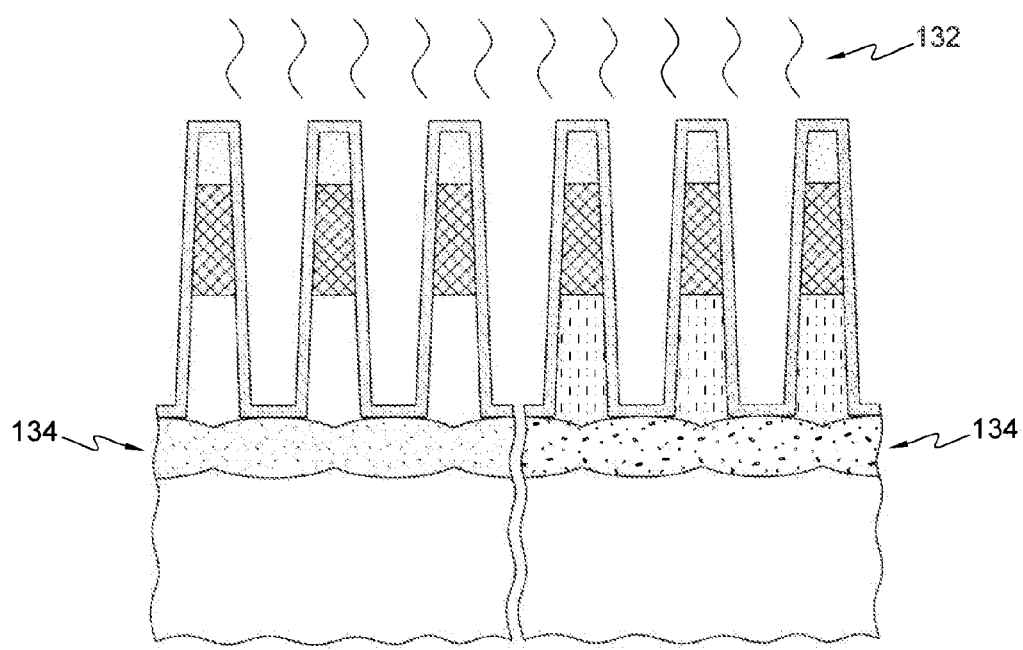
FIG. 6 depicts one example of the structure of FIG. 5 after removing the mask over the n-type device region and annealing the structure to diffuse the punch-through-stops across each region, in accordance with one or more aspects of the present invention.

FIG. 6 depicts one example of the structure of FIG. 5 after removing the mask (126, FIG. 5) over the n-type device region 104 and annealing 132 the structure to diffuse 134 the punch-through-stops across each region, in accordance with one or more aspects of the present invention.

Removal of the mask over the n-type device region may be accomplished, for example, using conventional processes and techniques. In one example, the anneal may be at a temperature of about 600° C. to about 1300° C. The duration of the anneal may be, for example, about 100 ns (relatively high temperature) to about 10 min (relatively low temperature).

Figure 7:
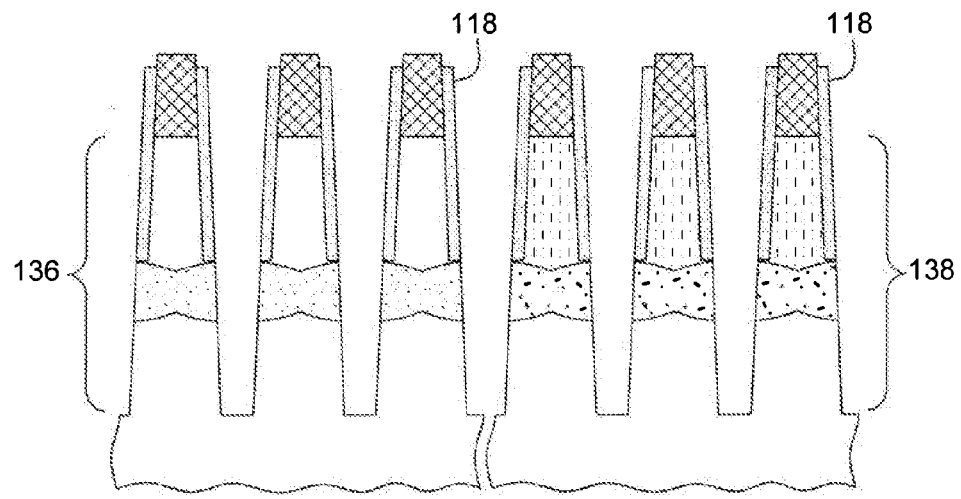
FIG. 7 depicts one example of the structure of FIG. 6 after creating at least one full fin from the at least one partial fin in each region, which also serves to partially remove the conformal liner, in accordance with one or more aspects of the present invention.

FIG. 7 depicts one example of the structure of FIG. 6 after creating at least one full fin (e.g., fins 136 and 138) from the at least one partial fin in each region, which also serves to partially remove the conformal liner 118, in accordance with one or more aspects of the present invention.

In one example, the hard mask layer of the liner is removed (e.g., via wet or dry etch) prior to creating the full fins, which may be accomplished using, for example, conventional processes and techniques (e.g., reactive ion etch process). The dielectric layer of the liner may also be removed prior to creating the full fins.

Figure 8:
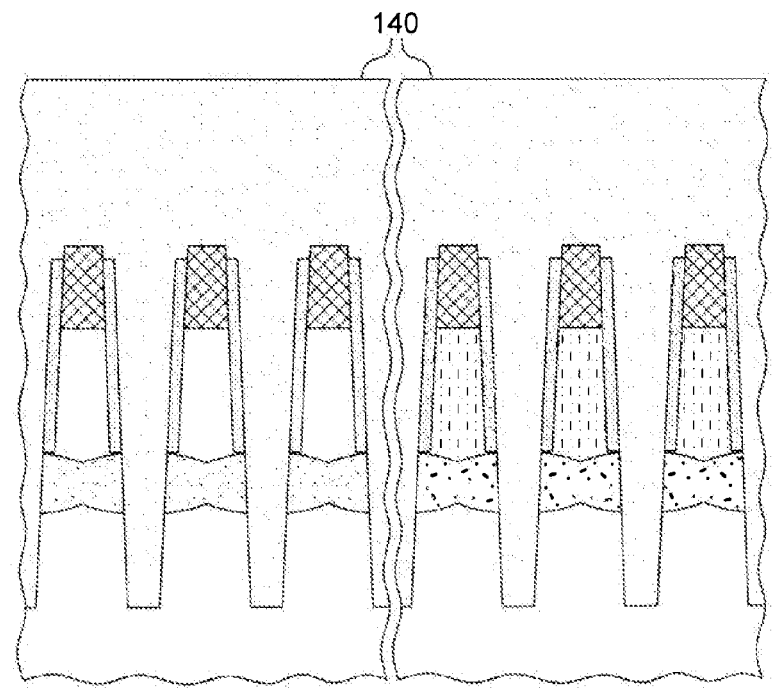
FIG. 8 depicts one example of the structure of FIG. 7 after creating a blanket conformal dielectric layer over the structure, in accordance with one or more aspects of the present invention.

FIG. 8 depicts one example of the structure of FIG. 7 after creating a blanket conformal dielectric layer 140 over the structure, in accordance with one or more aspects of the present invention, In one example, the blanket conformal dielectric layer may include, for example, an oxide (e.g., a shallow trench isolation oxide), and may be created, for example, using conventional processes and techniques (e.g., conventional deposition processes).

Figure 9:
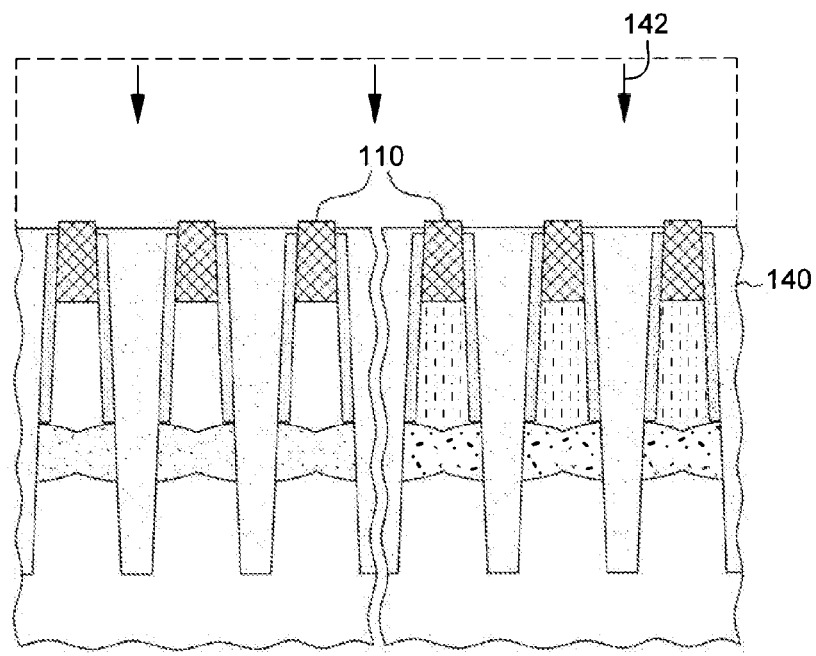
FIG. 9 depicts one example of the structure of FIG. 8 after recessing the conformal dielectric layer down to the hard mask layer over the fins, in accordance with one or more aspects of the present invention.

FIG. 9 depicts one example of the structure of FIG. 8 after recessing 142 the blanket conformal dielectric layer 140 down to the hard mask layer 110 over the fins, in accordance with one or more aspects of the present invention.

Recessing the blanket conformal dielectric layer may be accomplished, for example, using conventional processes and techniques (e.g., a chemical-mechanical polishing process using the hard mask layer on the fins as a stop).

Figure 10:
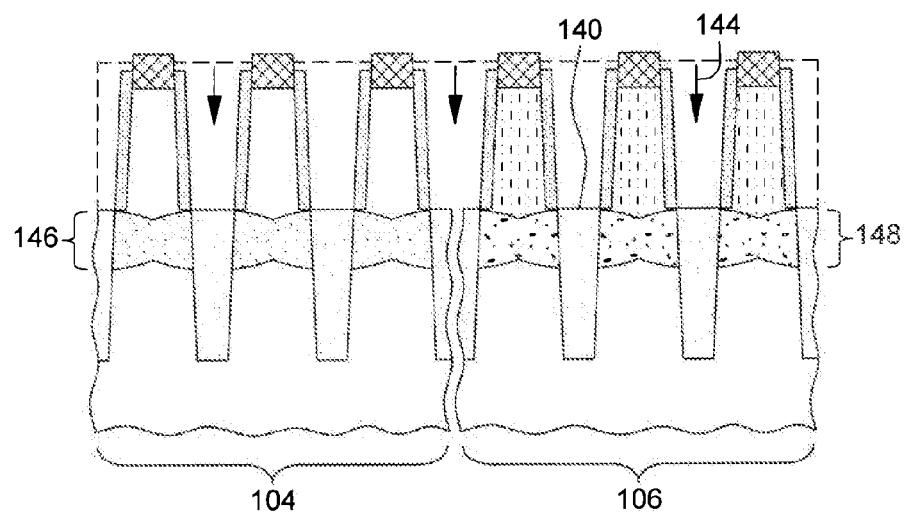
FIG. 10 depicts one example of the structure of FIG. 9 after further recessing the conformal dielectric layer down to the diffused punch-through-stop in each fin of each device region, which further recessing may also partially remove the hard mask layers, in accordance with one or more aspects of the present invention.

FIG. 10 depicts one example of the structure of FIG. 9 after further recessing 144 the conformal dielectric layer 140 down to the diffused punch-through-stop in each fin of each device region (e.g., diffused PTS 146 in n-type device region 104 and diffused PTS 148 in p-type device region 106), which further recessing may also partially remove the hard mask layers, in accordance with one or more aspects of the present invention.

Further recessing the blanket conformal dielectric layer may be accomplished, for example, using conventional processes and techniques (e.g., conventional wet and/or dry processes using the PTS's as a stop).

Figure 11:
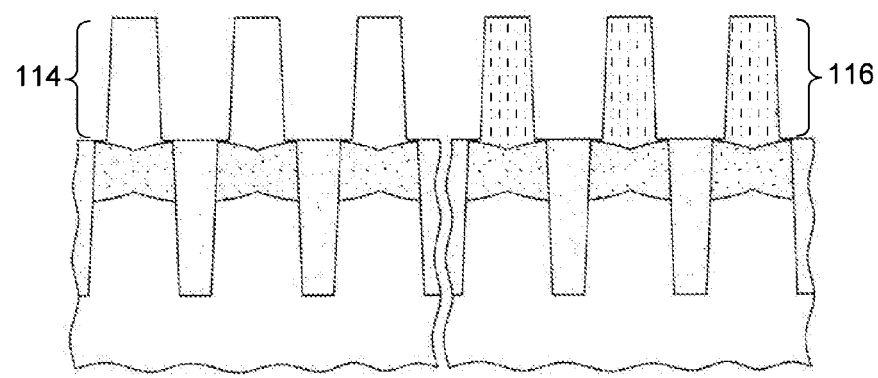
FIG. 11 depicts one example of the structure of FIG. 10 after removing a remainder of the conformal liner and any hard mask layer remaining over the top portions of the fins, in accordance with one or more aspects of the present invention.

FIG. 11 depicts one example of the structure of FIG. 10 after removing a remainder of the conformal liner (118, FIG. 7) and any hard mask layer (110, FIG. 9) remaining over the top portions (114, 116) of the fins, in accordance with one or more aspects of the present invention.

In one example, removal of the remaining liner and hard mask layers may be accomplished together, using, for example, conventional processes and techniques. Any remaining dielectric material above the PTS's can be removed, for example, by stripping the same with a cleaning step.

Figure 12:
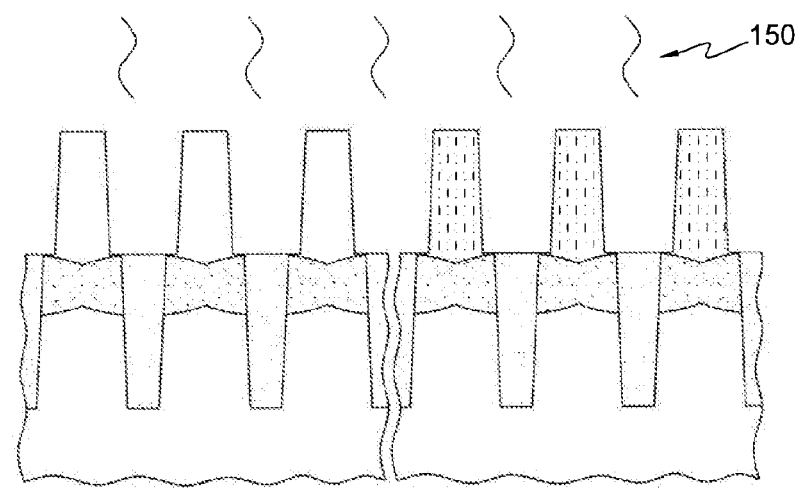
FIG. 12 depicts one example of the structure of FIG. 11 after optionally annealing the structure to activate the same.

FIG. 12 depicts one example of the structure of FIG. 11 after optionally annealing 150 the structure to activate the same. In one example, the anneal may be accomplished using conventional processes and techniques.

In a first aspect, disclosed above is a method. The method includes providing a starting semiconductor structure, the structure including a semiconductor substrate having a n-type device region and a p-type device region, the p-type device region including an upper layer of p-type semiconductor material and a hard mask layer over both regions. The method further includes creating partial fin(s) in each region, creating a punch-through-stop (PTS) in each region and creating full fin(s) in each region from the partial fin(s) in each region.

In one example, creating the partial fin(s) in each region may include, for example, partially etching both regions of the starting structure. In one example, the partially etching stops, for example, at a bottom surface of the layer of p-type semiconductor material.

In one example, the method of the first aspect may include, for example, creating a conformal liner over the structure after creating the at least one partial fin in each region and prior to creating a PTS in each region. In one example, creating the conformal liner may include, for example, creating a lower layer of dielectric material, and creating an upper layer of hard mask material. In addition, creating the at least one full fin, may include, for example, first removing the layer of hard mask material and then etching the substrate.

In one example, the starting structure in the method of the first aspect may further include, for example, a mask thereover, and creating at least one partial fin in each region may include patterning with the mask.

In one example, creating the PTS in each region in the method of the first aspect may include, for example, masking a first region while leaving a second region unmasked, creating a PTS in the second region, removing the mask, and repeating the masking, creating and removing for opposite regions (i.e., switch first and second regions in those aspects).

In one example, creating a PTS in each region in the method of the first aspect may include, for example, implanting impurities in the substrate adjacent the at least one partial fin in each region, and causing each PTS to diffuse across a top portion of the substrate. In one example, causing the PTS in each region to diffuse may include, for example, annealing the structure.

In one example, a material of the PTS in the n-type device region in the method of the first aspect may include, for example, one of boron and difluoroboron.

In one example, a material of the PTS in the p-type device region in the method of the first aspect may include, for example, one of arsenic and phosphorous.

In one example, the method of the first aspect may further include, for example, surrounding a bottom portion of the full fins with an insulating material to a top of each PTS. In addition, the method may further include, for example, removing the hard mask layer above each fin and any remaining dielectric from the conformal liner. The method may further include, for example, performing an activation anneal.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
    providing a starting semiconductor structure, the structure comprising a semiconductor substrate having a n-type device region and a p-type device region, the p-type device region including an upper layer of p-type semiconductor material and a hard mask layer over both regions;
    creating at least one partial fin in each region;
    creating a punch-through-stop (PTS) in each region;
    causing each PTS in a respective region to diffuse across an entire top portion thereof and below a top surface of the substrate; and
    creating at least one full fin in each region from the at least one partial fin in each region.

2. The method of claim 1, wherein creating the at least one partial fin in each region comprises partially etching both regions of the starting structure.

3. The method of claim 2, wherein the partially etching stops at a bottom surface of the layer of p-type semiconductor material.

4. The method of claim 1, further comprising creating a conformal liner over the structure after creating the at least one partial fin in each region and prior to creating a PTS in each region.

5. The method of claim 4, wherein creating the conformal liner comprises:
    creating a lower layer of dielectric material; and
    creating an upper layer of hard mask material.

6. The method of claim 5, wherein creating the at least one full fin comprises:
    first removing the layer of hard mask material; and
    etching the substrate.

7. The method of claim 1, wherein the starting structure further comprises a mask thereover, and wherein creating at least one partial fin in each region comprises patterning with the mask.

8. The method of claim 1, wherein creating the PTS in each region comprises:
    masking a first region while leaving a second region unmasked;
    creating a PTS in the second region;
    removing the mask; and
    repeating the masking, creating and removing for opposite regions.

9. The method of claim 1, wherein creating a PTS in each region comprises implanting one or more impurities in the substrate adjacent the at least one partial fin in each region.

10. The method of claim 9, wherein causing the PTS in each region to diffuse comprises annealing the structure.

11. The method of claim 1, wherein a material of the PTS in the n-type device region comprises one of boron and difluoroboron.

12. The method of claim 1, wherein a material of the PTS in the p-type device region comprises one of arsenic and phosphorous.

13. The method of claim 4, further comprising surrounding a bottom portion of the at least one full fin with an insulating material to a top of each PTS.

14. The method of claim 13, further comprising removing the hard mask layer above each fin and any remaining dielectric from the conformal liner.

15. The method of claim 14, further comprising performing an activation anneal.

* * * * *